(12) United States Patent
Park et al.

(10) Patent No.: US 9,035,196 B2
(45) Date of Patent: May 19, 2015

(54) CIRCUIT BOARD AND METHOD OF MANUFACTURING THE SAME

(71) Applicant: Samsung Electro-Mechanics Co., Ltd., Suwon (KR)

(72) Inventors: Seung Wook Park, Suwon (KR); Jae Kul Lee, Suwon (KR); Jin Gu Kim, Suwon (KR); Chang Bae Lee, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 76 days.

(21) Appl. No.: 13/827,002

(22) Filed: Mar. 14, 2013

(65) Prior Publication Data

US 2014/0174809 A1    Jun. 26, 2014

(30) Foreign Application Priority Data

Dec. 20, 2012  (KR) ........................ 10-2012-0149556

(51) Int. Cl.
*H05K 1/11* (2006.01)
*H05K 3/10* (2006.01)

(52) U.S. Cl.
CPC ................ *H05K 1/115* (2013.01); *H05K 3/107* (2013.01)

(58) Field of Classification Search
USPC .......... 174/250, 260, 261, 262, 266; 361/760, 361/792–795
See application file for complete search history.

(56) References Cited

U.S. PATENT DOCUMENTS

| 7,147,141 | B2 * | 12/2006 | Sato et al. ................ 228/180.22 |
| 8,186,052 | B2 * | 5/2012 | Iida et al. ........................ 29/852 |
| 8,215,011 | B2 * | 7/2012 | Ahn et al. ....................... 29/852 |
| 8,791,372 | B2 * | 7/2014 | Harvey et al. ................. 174/264 |

FOREIGN PATENT DOCUMENTS

| JP | 63-275156 | 11/1988 |
| JP | 3012590 | 2/2000 |
| JP | 2001-68807 | 3/2001 |
| KR | 10-2007-0086864 | 8/2007 |
| KR | 10-2010-0065690 | 6/2010 |

OTHER PUBLICATIONS

Korean Office Action mailed Nov. 27, 2013 in corresponding Korean Application No. 10-2012-0149556.
Korean Notice of Allowance mailed Feb. 24, 2014 in corresponding Korean Application No. 10-2012-0149556.

* cited by examiner

*Primary Examiner* — Angel R Estrada
*Assistant Examiner* — Dimary Lopez Cruz (57) ABSTRACT

Disclosed herein is a circuit board including: a core layer including a via hole; a metal film covering an inner wall of the via hole; a circuit pattern connected to the metal film on the core layer; and a plug surrounded by the metal film in the via hole and having a thickness thinner than a thickness of the core layer.

6 Claims, 5 Drawing Sheets

CIRCUIT BOARD AND METHOD OF MANUFACTURING THE SAME

CROSS REFERENCE(S) TO RELATED APPLICATIONS

This application claims the benefit under 35 U.S.C. Section 119 of Korean Patent Application Serial No. 10-2012-0149556, entitled "Circuit Board and Method of Manufacturing the Same" filed on Dec. 20, 2012, which is hereby incorporated by reference in its entirety into this application.

BACKGROUND OF THE INVENTION

1. Technical Field

The present invention relates to a circuit board and a method of manufacturing the same, and more particularly, to a circuit board capable of increasing adhesion between a circuit pattern and a via and reducing manufacturing cost and a method of manufacturing the same.

2. Description of the Related Art

As electronic products have been recently slim and high functional, circuit boards such as a printed circuit board (PCB) applied to the electronic products have been also thin and multilayer boards. To meet this trend, it is indispensable to implement a fine-pitch and thin-film circuit structure consisting of a circuit pattern of a circuit board and a via for an interlayer conduction.

A general PCB is manufactured by sequentially performing operations of preparing a core board such as a copper clad laminate (CCL), forming a via hole in the core board, forming a plating film in an inner wall of the via hole, filling the via hole with a predetermined filler, manufacturing a plug, and forming the circuit structure on the core board.

However, the circuit board manufactured through the above operations has a structure having low adhesion between a metal film formed in the inner wall of the via hole and the circuit pattern connected to the via on the core board. More specifically, a thickness of the plug of the above-manufactured circuit board is the same as or greater than a thickness of the core board. In this case, a bonding area between the circuit pattern formed on a surface of the core board and the metal film is small, which reduces the adhesion between the metal film and the circuit pattern.

Further, the above-described circuit board has a very complicated manufacturing process. For example, the process of manufacturing the circuit board includes a plug filling operation and then sequentially a buff polishing operation and an insulation layer stacking operation on the core board in which the plug is filled. As described above, in a case where the plug filling operation and the insulation layer stacking operation are separately performed, additional operations are performed between the two operations, which makes a board manufacturing process complicated and accordingly, manufacturing cost of the circuit board increases.

RELATED ART DOCUMENT

Patent Document (Patent Document 1) Japanese Patent Laid-Open Publication No. 1998-00249382

SUMMARY OF THE INVENTION

An object of the present invention is to provide a circuit board that improves a bonding reliability of a circuit structure and implements a fine circuit pattern.

Another object of the present invention is to provide a circuit board that improves adhesion between a metal film formed in a via hole of a core layer and a circuit pattern formed on a surface of the core layer and has a fine pattern.

Another object of the present invention is to provide a method of manufacturing a circuit board that simplifies a manufacturing process and reduces manufacturing cost of a circuit board.

Another object of the present invention is to provide a method of manufacturing a circuit board that improves adhesion between a metal film formed in an inner wall of a via hole of a core board and a circuit pattern formed on a surface of a core layer and implements a fine inner layer circuit.

According to an exemplary embodiment of the present invention, there is provided a circuit board including: a core layer including a via hole; a metal film covering an inner wall of the via hole; a circuit pattern connected to the metal film on the core layer; and a plug surrounded by the metal film in the via hole and having a thickness thinner than a thickness of the core layer.

The circuit board may further include: an interlayer insulation film covering the circuit pattern on the core layer, wherein the plug is a photosensitive film formed of the same material as the interlayer insulation film.

The circuit board may further include: an interlayer insulation film covering the circuit pattern on the core layer, wherein one of the plug and the interlayer insulation film is a photosensitive film on which photo-hardening is performed, and another one of the plug and the interlayer insulation film is a photosensitive film on which photo-hardening is not performed.

The metal film may be a plating film formed of the same material as the circuit pattern.

The circuit board may further include: an interlayer insulation film covering the circuit pattern on the core layer such that the metal film is exposed; and a via surrounded by the interlayer insulation film in a region facing the plug and connected to the metal film.

The via may enter the via hole to be be connected to the metal film.

According to another exemplary embodiment of the present invention, there is provided a method of manufacturing a circuit board, the method including: forming a core layer including a via hole; forming a circuit structure covering an inner wall of the via hole and the core layer; forming an insulation film filled in the via hole and covering the core layer on the core layer; and etching the insulation film such that a thickness of the insulation film filled in the via hole is thinner than a thickness of the core layer.

The etching of the insulation film may include: defining an open region facing the via hole and a non-open region other than the open region with respect to the insulation film; and performing an etching process under a condition in which an etching speed of the open region is faster than an etching speed of the non-open region with respect to the insulation film.

The forming of the insulation film may include: forming a photosensitive film on the core layer, and the etching of the insulation film may include: hardening the photosensitive film of a region excluding a region facing the via hole; and performing a developing process on the photosensitive film.

The forming of the insulation film may include: forming a photosensitive film on the core layer, and the etching of the insulation film may include: hardening the photosensitive film of a region facing the via hole; and performing a developing process on the photosensitive film.

The etching of the insulation film may include: forming a plug filling the via hole and forming an interlayer insulation film covering the circuit structure on the core layer.

The forming of the core layer may include: preparing a copper clad laminate (CCL); and forming a through hole in the CCL.

DESCRIPTION OF THE PREFERRED EMBODIMENTS

Advantages and characteristics of the present invention, and a method for achieving them will be apparent with reference to embodiments described below in addition to the accompanying drawings. However, the present invention is not limited to the embodiments disclosed below, but may be implemented in various forms. The embodiments may be provided to completely disclose the present invention and allow those skilled in the art to completely know the scope of the present invention. Throughout the specification, like elements refer to like reference numerals.

Terms used in the specification are used to explain the embodiments and not to limit the present invention. In the specification, a singular type may also be used as a plural type unless stated specifically. The terms "comprises" and/or "comprising" used in the specification mentioned constituent members, steps, operations and/or elements do not exclude the existence or addition of one or more other components, steps, operations and/or elements.

Further, the exemplary embodiments described in the specification will be described with reference to cross-sectional views and/or plan views that are ideal exemplification figures. In the drawings, the thickness of layers and regions may be exaggerated for efficient description of technical contents and consequently, exemplified forms may be changed by manufacturing technologies and/or tolerances. Therefore, the exemplary embodiments of the present invention are not limited to specific forms but may include the change in forms generated according to the manufacturing processes. For example, an etching region vertically shown may be rounded or may have a predetermined curvature.

A circuit board and a method of manufacturing the circuit board according to embodiments of the present invention will now be described in detail with reference to accompanying drawings below.

Figure 1:
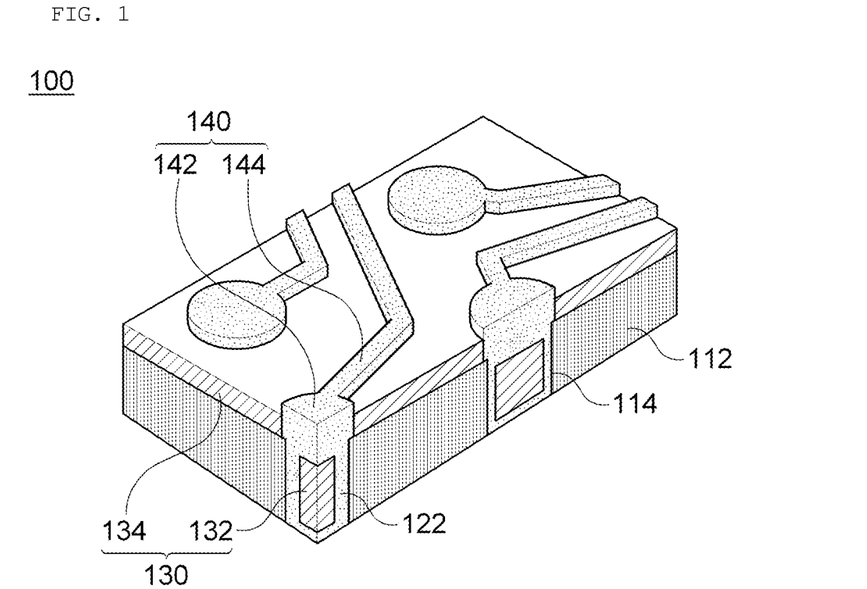
FIG. 1 is a perspective view of a circuit board according to an embodiment of the present invention.
Figure 2:
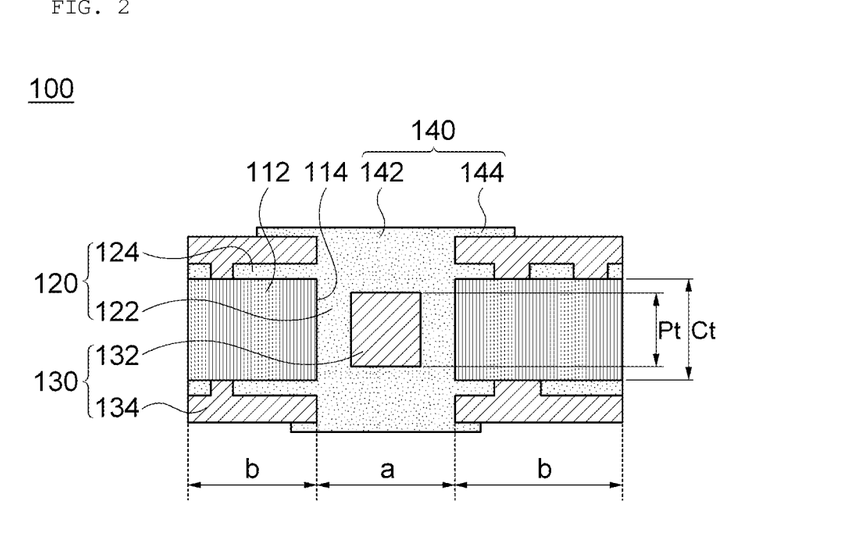
FIG. 2 is a cross-sectional view of a circuit board according to an embodiment of the present invention.

FIG. 1 is a perspective view of a circuit board 100 according to an embodiment of the present invention. FIG. 2 is a cross-sectional view of the circuit board 100 according to an embodiment of the present invention.

Referring to FIGS. 1 and 2, the circuit board 100 according to an embodiment of the present invention may include a core layer 112, a first circuit structure 120, an insulation film structure 130, and a second circuit structure 140.

The core layer 112 may be generally disposed in an inner center of the circuit board 100. The core layer 112 may be a base board for manufacturing the first circuit structure 120, the insulation film structure 130, and the second circuit structure 140 of the circuit board 100. The first circuit structure 120, the insulation film structure 130, and the second circuit structure 140 may be resultants formed by performing a board manufacturing process on the core layer 112. The core layer 112 may include at least one via hole 114 that passes through the core layer 112.

Meanwhile, the core layer 112 may be divided into an open region a and a non-open region b other than the open region a. The open region a may be a region corresponding to a region in which the via hole 114 is formed. The non-open region b may be a region in which the via hole 114 is not formed.

The first circuit structure 120 may include a metal film 122 and a first circuit pattern 124. The metal film 122 may cover an inner wall of the via hole 114. The metal film 122 may be formed along the inner wall of the via hole 114 and may generally have a ring shape. The first circuit pattern 124 may have a structure covering one side or both sides of the core layer 112, and may be electrically connected to the metal film 122. In this regard, the metal film 122 and the first circuit pattern 124 may be resultants formed by performing the same plating process on the core layer 112. Accordingly, the metal film 122 and the first circuit pattern 124 may be formed of the same metal material, may have no boundary surface therebetween, and may be integrally formed.

The insulation layer structure 130 may include a plug 132 and an interlayer insulation film 134. The plug 132 may be formed by filling a predetermined insulation material in the via hole 114 in which the metal film 122 is formed. Thus, the plug 132 may have a structure surrounded by the metal film 122 in the via hole 114. The interlayer insulation film 134 may cover the first circuit pattern 124 on the core layer 112. The interlayer insulation film 134 may cover the circuit pattern 124 such that the open region a may be selectively exposed. Accordingly, the interlayer insulation film 134 may include an opening through which the metal film 112 is exposed.

The plug 132 and the interlayer insulation film 134 may be resultants formed by performing the same insulation film forming process. Accordingly, the plug 132 and the interlayer insulation film 134 may be formed of the same insulation material. Also, the insulation film structure 130 may be formed of a photosensitive material. As an example, the insulation film structure 130 may be a predetermined photosensitive film. Thus, the plug 132 and the interlayer insulation film 134 may be resultants formed by performing a photolithography process on the photosensitive film. In this regard, the plug 132 and the interlayer insulation film 134 may be formed due to a photoreaction difference during the photolithography process for the pattern. The photosensitive material may use the photoreaction difference during the photolithography process according to positive and negative characteristics so as to form the pattern. The present invention may selectively use positive and negative type photosensitive materials.

The second circuit structure 140 may include a via 142 and a second circuit pattern 144. The via 142 may be stacked on a region facing the via hole 114 of the first circuit structure 120. The via 142 may be disposed facing the metal film 122 up and down and may be electrically connected to the first circuit structure 120. The second circuit pattern 144 may be formed to be electrically connected to the via 142 on the interlayer insulation film 134. Also, a circumference of the via 142 may have a structure surrounded by the interlayer insulation film 134. In addition, the via 142 may have a structure in which the via 142 further enters the via hole 114 compared to a surface of the core layer 112 to be directly connected to the metal film 112.

Meanwhile, the metal film 122 and the first circuit pattern 124 may be bonded to each other to have high adhesion therebetween. More specifically, a thickness Pt of the plug 132 may be provided to be thinner than a thickness Ct of the core layer 112. Accordingly, a thickness difference between a surface of the plug 132 and the surface of the core layer 112 takes place so that a step difference of a predetermined height may occur between the core layer 112 and the plug 132 due to the thickness difference. Such a stepped structure increases a contact area between the metal film 122 and the first circuit pattern 124, thereby increasing adhesion between the metal film 122 and the first circuit pattern 124. In addition, the via 142 of the second circuit structure 140 may have a structure in which the via 142 further extends from the surface of the core layer 112 to the inside of the via hole 114 and is connected to the metal film 122, and thus adhesion between the first circuit pattern 124 and the via 142 may also increase.

As described above, the circuit board 100 according to an embodiment of the present invention may include the core layer 112 including the via hole 114, the first circuit structure 120 including the metal film 122 that covers the inner wall of the via hole 114 and the first circuit pattern 124 formed in the surface of the core layer 112, and the insulation film structure 130 including the plug 132 filled in the via hole 114 and the interlayer insulation film 134 covering the surface of the core layer 112, and may have a structure in which the thickness Pt of the plug 132 is thinner than the thickness Ct of the core layer 112. In this case, the step difference between the core layer 112 and the plug 132 occurs, and thus the bonding area between the metal film 122 and the first circuit pattern 124 may increase. Accordingly, the circuit board 100 according to the present invention may have a structure that improves adhesion between the metal film 122 and a circuit pattern by making the thickness Pt of the plug 132 filled in the via hole 114 formed in the core layer 112 thinner than the thickness Ct of the core layer 112 and increasing a bonding area between the metal film 122 formed in the via hole 114 and the circuit pattern covering the core layer 112.

The circuit board 100 according to the present invention may have a fine inner layer circuit compared to an inner layer circuit formed through a tenting process by given panel plating and buff polishing since plugging is performed after an inner circuit pattern is formed.

Continuously, a method of manufacturing the circuit board 100 according to an embodiment of the present invention will now be described in detail. In this regard, a redundant description regarding the circuit board 100 described above will be omitted or simplified.

Figure 3:
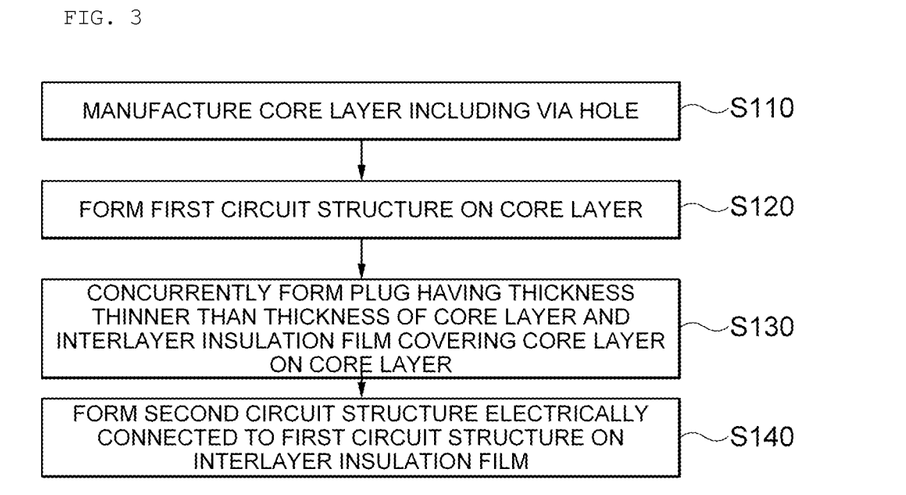
FIG. 3 is a flowchart of a method of manufacturing a circuit board according to an embodiment of the present invention.

FIG. 3 is a flowchart of a method of manufacturing the circuit board 100 according to an embodiment of the present invention. FIGS. 4A through 4F are diagrams for explaining the method of manufacturing the circuit board 100 according to an embodiment of the present invention.

Figure 4A:
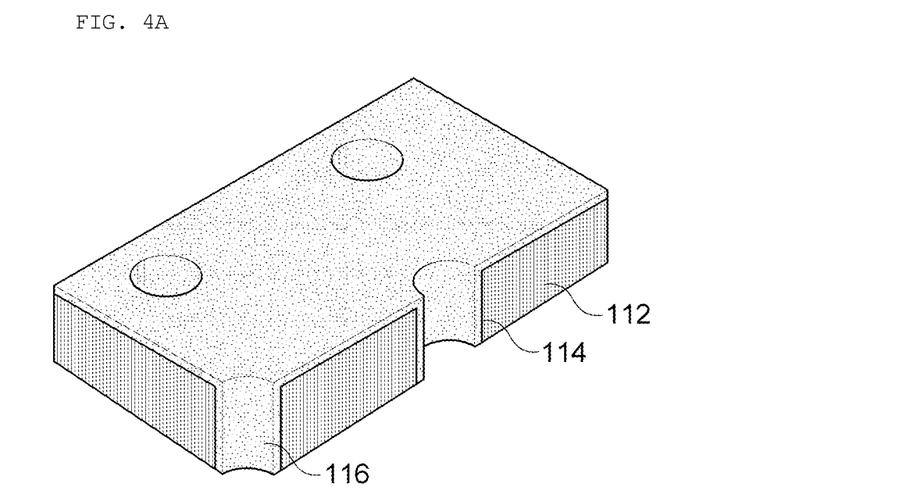
FIGS. 4A through 4F are diagrams for explaining a method of manufacturing a circuit board according to an embodiment of the present invention.

Referring to FIGS. 3 and 4A, the core layer 112 including the via hole 114 may be manufactured (S110). The operation of manufacturing the core layer 112 may include operations of preparing a copper clad laminate (CCL), forming a through hole in the CCL, and performing a plating process on the CCL in which the through hole is formed. The operation of forming the through hole may be performed by performing a mechanical drilling process on the CCL. The operation of performing the plating process may be performed by performing an electroless plating process on the CCL in which the through hole is formed. Accordingly, the via hole 114 that passes through the core layer 112 and an electroless plating film 116 that covers the inner wall of the via hole 114 may be formed in the core layer 112.

Figure 4B:
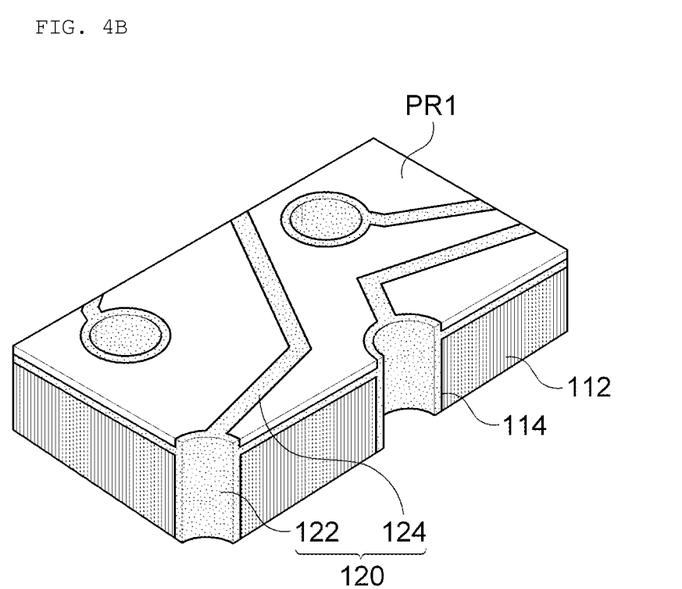
Figure 4C:
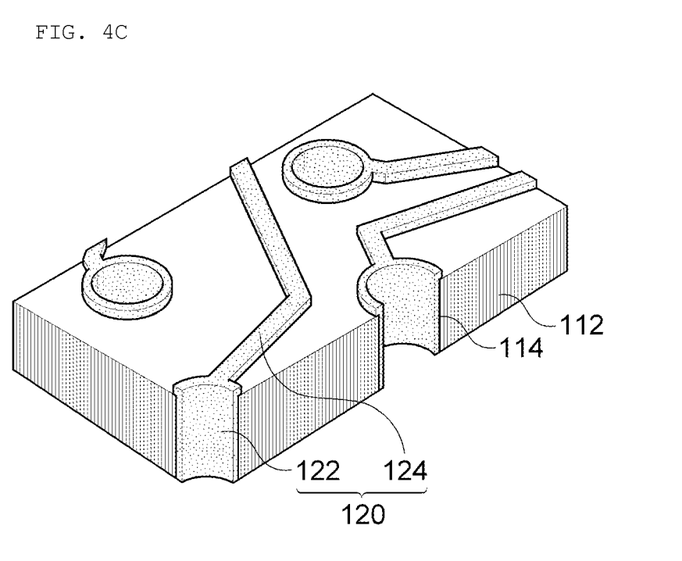

Referring to FIGS. 3, 4B, and 4C, the first circuit structure 120 may be formed on the core layer 112 (S120). The operation of forming the first circuit structure 120 may include operations of forming a first resist pattern RP1 that exposes a circuit pattern forming region on the electroless plating film 116 of the core layer 112, forming a circuit pattern in the circuit pattern forming region by performing the plating process using the first resist pattern RP1 as a plating prevention film, removing the first resist pattern RP1 so as to expose the electroless plating film 116 on the core layer 112, and performing a front etching process on a resultant from which the first resist pattern RP1 is removed so as to selectively remove the electroless plating film 116. Accordingly, the first circuit structure 120 including the metal film 122 that covers the inner wall of the via hole 114 and the first circuit pattern 124 that covers both sides of the core layer 112 and is connected to the metal film 122 may be formed on the core layer 112.

Figure 4D:
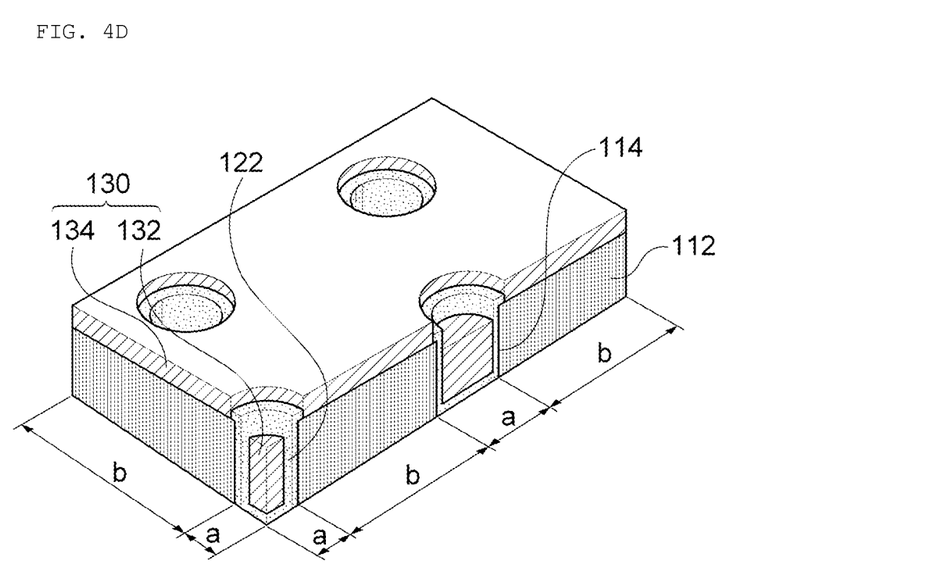

Referring to FIGS. 3 and 4D, the plug 132 having a thickness thinner than a thickness of the core layer 112 and the interlayer insulation film 134 covering the core layer 112 may be concurrently formed on the core layer 112 (S130). More specifically, an insulation film may be formed with respect to the core layer 112. A photosensitive film may be used as the insulation film. As an example, a photoresist film may be used as the insulation film. The insulation film may be formed to cover both sides of the core layer 112 while being filled in the via hole.

The open region a facing the via hole 114 and the non-open region b other than the open region a may be defined with respect to the insulation film. The operation of defining the open region a and the non-open region b may be performed by light hardening the non-open region b. As an example, the open region a and the non-open region b may be defined by selectively irradiating light only on the non-open region b and hardening the non-open region b while not hardening the open region a. As another example, the open region a and the non-open region b may be defined by irradiating light only on the open region a while not irradiating light only on the non-open region b.

Further, the insulation film may be etched through an etching process having an etching condition in which an etching speed of the open region a is faster than an etching speed of the non-open region b. The operation of etching the insulation film may be performed through a developing process on the entire of the insulation film. A developing liquid used in the developing process may remove the open region a by etching the insulation film at a relatively faster etching speed of the open region a than that of the hardened non-open region b.

Meanwhile, the developing process may etch the insulation film such that a thickness of the insulation film filled in the via hole 114 is thinner than a thickness of the core layer 112. To this end, the developing process may adjust a processing time or a developing liquid supply condition such that the developing liquid is over-etched on the open region a. As an example, the open region a is sunken by a predetermined depth from the non-open region b during the developing process, and thus the insulation film of the open region a may be over-etched by adjusting the processing time such that the developing liquid may remain in the sunken open region a for a long time. Accordingly, the plug 132 having the thickness thinner than the thickness of the core layer 112 and the interlayer insulation film 134 covering both sides of the core layer 112 may be concurrently formed in the via hole 114.

Figure 4E:
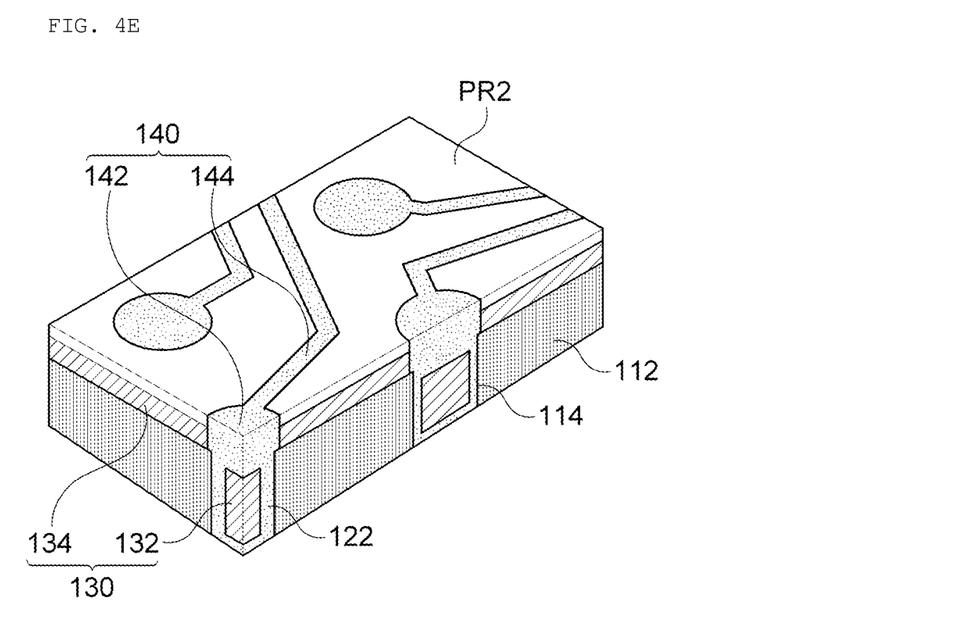

Referring to FIGS. 3 and 4E, the second circuit structure 140 electrically connected to the first circuit structure 120 (of FIG. 2) may be formed on the interlayer insulation film 134 (S140). The operation of forming the second circuit structure 140 may include operations of forming an electroless plating film (not shown) by performing an electroless plating process on a resultant on which operation S130 is performed, forming a second resist pattern RP2 that exposes the circuit pattern forming region on the electroless plating film, and forming a plating process by using the second resist pattern RP2 as a plating prevention film. The electroless plating film may be formed on the plug 132 and the interlayer insulation film 134 as a seed layer for forming the second circuit structure 140 on the resultant. The operation of forming the second resist pattern RP2 may be performed by attaching a dry film resist (DFR) that selectively exposes a region for forming the second circuit pattern 144 on the electroless plating film. Accordingly, the via 142 connected to the metal film 122 may be formed on the plug 132 and the second circuit pattern 144 electrically connected to the via 142 may be formed on the interlayer insulation film 134, through the electroless plating process.

Figure 4F:
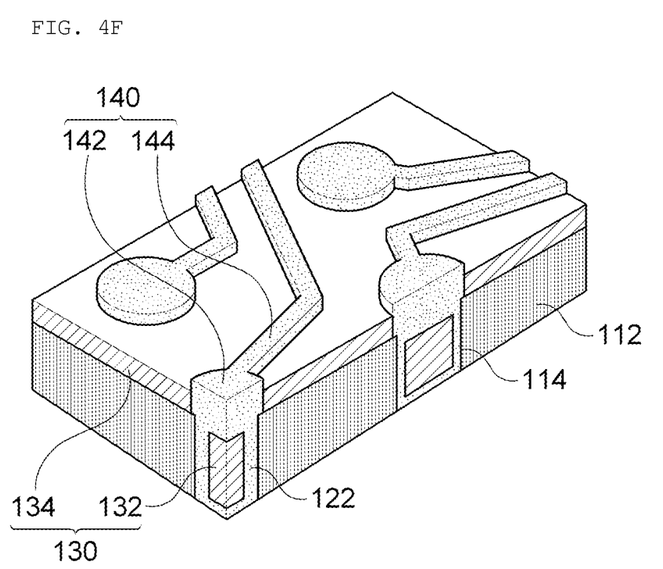

Referring to FIGS. 3 and 4F, operations of removing the second resist pattern RP2 such that the electroless plating film is exposed and selectively removing the exposed electroless plating film (not shown) may be performed. The operation of removing the second resist pattern RP2 may be performed through a predetermined strip process. The operation of selectively removing the exposed electroless plating film may be performed through a predetermined wet etching process. Accordingly, the second circuit structure 140 including the via 142 and the second circuit pattern 144 may be formed on the interlayer insulation film 134.

As described above, the method of manufacturing the circuit board 100 according to an embodiment of the present invention may manufacture the core layer 112 including the via hole 114, forms the first circuit structure 120 on the core layer 112, concurrently form the plug 132 having the thinner thickness than the core layer 112 and the interlayer insulation film 134, and then form the second circuit structure 140 electrically connected to the first circuit structure 120. In this case, the plug 132 is formed to have the thinner thickness than the core layer 112, which increases a bonding area between the via 142 and the second circuit pattern 144, thereby improving adhesion between the via 142 and the second circuit pattern 144. Accordingly, the method of manufacturing the circuit board 100 according to an embodiment of the present invention may manufacture the circuit board 100 having a structure that improves adhesion between the metal film 122 and a circuit pattern by making a thickness of the plug 132 filled in the via hole 114 formed in the core layer 112 thinner than a thickness of the core layer 112 during the circuit board manufacturing process and increasing a bonding area between the metal film 122 formed in the via hole 114 and the circuit pattern covering the core layer 112.

Further, the method of manufacturing the circuit board 100 according to an embodiment of the present invention may concurrently form the plug 132 and the interlayer insulation film 134 through a series of process. In this case, compared to a case of separately performing a plug filling operation of filling the via hole 114 and an operation of forming the interlayer insulation film 134, the plug 132 and the interlayer insulation film 134 may be formed through a single process and an additional operation such as a buff polishing operation is not necessarily performed, thereby implementing a further fine inner layer circuit. Accordingly, the method of manufacturing the circuit board 100 according to the present invention may concurrently form the plug 132 filled in the via hole 114 and the interlayer insulation film 134 through a single process, thereby simplifying a manufacturing process of the circuit board 100 and reducing manufacturing cost thereof.

As described above, a circuit board according to the present invention may have a structure that improves adhesion between a metal film and a circuit pattern by making a thickness of a plug filled in a via hole formed in a core layer thinner than a thickness of the core layer and increasing a bonding area between the metal film formed in the via hole and the circuit pattern covering the core layer.

The circuit board according to the present invention may have a fine inner layer circuit compared to an inner layer circuit formed through a tenting process by given panel plating and buff polishing since plugging is performed after an inner circuit pattern is formed.

A method of manufacturing the circuit board according to the present invention may manufacture the circuit board having a structure that improves adhesion between a metal film and a circuit pattern by making a thickness of a plug filled in a via hole formed in a core layer thinner than a thickness of the core layer during the circuit board manufacturing process and increasing a bonding area between the metal film formed in the via hole and the circuit pattern covering the core layer.

The method of manufacturing the circuit board according to the present invention may concurrently form a plug filled in the via hole and an interlayer insulation film through a single process, thereby simplifying a manufacturing process of the circuit board and reducing manufacturing cost thereof.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the detailed description of the present invention does not intend to limit the present invention to the disclosed embodiments. Further, it should be appreciated that the appended claims include even another embodiment.

What is claimed is:

1. A circuit board comprising:
   a core layer including a via hole;
   a metal film covering an inner wall of the via hole;
   a circuit pattern connected to the metal film on the core layer; and
   a plug surrounded by the metal film in the via hole and having a thickness thinner than a thickness of the core layer.

2. The circuit board according to claim 1, further comprising:
   an interlayer insulation film covering the circuit pattern on the core layer,
   wherein the plug is a photosensitive film formed of the same material as the interlayer insulation film.

3. The circuit board according to claim 1, further comprising:
   an interlayer insulation film covering the circuit pattern on the core layer, wherein one of the plug and the interlayer insulation film is a photosensitive film on which photo-hardening is performed, and wherein another one of the plug and the interlayer insulation film is a photosensitive film on which photo-hardening is not performed.

4. The circuit board according to claim 1, wherein the metal film is a plating film formed of the same material as the circuit pattern.

5. The circuit board according to claim 1, further comprising:
  an interlayer insulation film covering the circuit pattern on the core layer such that the metal film is exposed; and
  a via surrounded by the interlayer insulation film in a region facing the plug and connected to the metal film.

6. The circuit board according to claim 5, wherein the via enters the via hole to be connected to the metal film.

* * * * *